United States Patent [19]
Volk et al.

[11] Patent Number: 5,543,734
[45] Date of Patent: Aug. 6, 1996

[54] VOLTAGE SUPPLY ISOLATION BUFFER

[75] Inventors: Andrew M. Volk, Loomis; Sajjad A. Zaidi, Folsom; Eric B. Selvin, San Jose, all of Calif.

[73] Assignee: Intel Corporation, Santa Clara, Calif.

[21] Appl. No.: 298,144

[22] Filed: Aug. 30, 1994

[51] Int. Cl.⁶ .................. H03K 19/0175; H03K 19/094
[52] U.S. Cl. ................. 326/83; 326/81; 326/68; 326/33; 326/34; 327/328; 327/543; 327/546
[58] Field of Search ................. 326/81, 83, 33, 326/34, 68, 121, 122

[56] References Cited

U.S. PATENT DOCUMENTS

| | | | |
|---|---|---|---|
| 4,122,360 | 10/1978 | Kawagai et al. | 326/121 |
| 4,937,477 | 6/1990 | Tsoi et al. | 326/68 |
| 5,117,131 | 5/1992 | Ochi et al. | 326/33 |
| 5,202,591 | 4/1993 | Walden | 326/83 |
| 5,208,488 | 5/1993 | Takiba et al. | 326/121 |
| 5,331,224 | 7/1994 | Ohannes et al. | 326/122 |

*Primary Examiner*—Edward P. Westin
*Assistant Examiner*—Richard Roseen
*Attorney, Agent, or Firm*—Blakely, Sokoloff, Taylor & Zafman

[57] ABSTRACT

A voltage supply isolation buffer which prevents a voltage applied to an input or output of an IC device from reaching the power supply plane of the device. An inverter circuit is modified such that Vdd is coupled to the source of the p-channel pull-up transistor through a pn diode with the p terminal coupled to Vdd and the n terminal coupled to the source of the p-channel transistor. Under normal operation, Vdd forward biases the diode allowing a high voltage to be applied to the output of the inverter circuit when the p-channel transistor turns on. If, however, a voltage is applied to the output of the inverter circuit by an external voltage supply which is higher than Vdd, the diode will be reverse biased, preventing the voltage at the output node from raising the Vdd level.

16 Claims, 5 Drawing Sheets

150

VOLTAGE SUPPLY ISOLATION BUFFER

FIELD OF THE INVENTION

The present invention relates to the field of integrated logic circuits and more particularly to a CMOS buffer circuit.

BACKGROUND OF THE INVENTION

Buffers are used as a means for coupling internal circuitry of an integrated circuit (IC) device to external inputs and outputs. Buffer circuits may serve many purposes. For example, some input buffer circuits sense an incoming signal level and translate it to signal levels useful inside the device. For example, the signal levels for interfacing to one type of IC device known as transistor-transistor logic (TTL) are 0.8 volts for a "low" level and 2.0 volts for a "high" level. The signal levels used by another type of device known as complimentary metal-oxide-semiconductor (CMOS) are zero volts for a low level and a high level equal to the positive supply level, typically 5.0 volts. A TTL input buffer will translate between the TTL input levels and CMOS levels. Output buffer circuits may be used to boost the strength of the outgoing signals so that they can be transmitted over longer distances or drive greater current loads than can the internal circuitry of the IC device. For example, an output buffer circuit may be used to increase the signal strength of information coming from the output of a computer in order to drive that information down the length of an external cable to a connected printer. Without such a buffer circuit, the signal may not be strong enough to reach the printer.

Some buffer circuits are used to protect the IC device from damage from electro-static discharge (ESD). Static charge can build up on people and equipment handling the IC devices. This charge can be transmitted to the device through input and output pins of the devices. ESD protection circuitry is needed to deaden the destructive impact that a static charge may have on an IC device. ESD protection circuits are incorporated into input and output buffers and are placed across power supply lines of internal circuitry to protect the IC device from static charge build-up.

For demonstration purposes below, it is assumed that a low voltage is that voltage which corresponds most closely with one particular logical state, while a high voltage is that voltage which corresponds most closely with the opposite logical state in a binary scheme. For example, in a 5 volt CMOS system, a voltage greater than approximately 2.5 V may be considered a logical "1" and a voltage less than approximately 2.5 V may be considered a logical "0". Of course, this correspondence may be reversed such that a low voltage represents a logical "1" and a high voltage represents a logical "0". In an alternate system which operates with a 3 V supply, for example, a voltage greater than approximately 1.5 V may be considered a logical "1" and a voltage less than approximately 1.5 V may be considered a logical "0". Of course, this correspondence may again be reversed. In general, the lower supply voltage (which is simply ground in many applications) plus one half the difference between the upper supply voltage minus the lower supply voltage of any system may be considered the approximate boundary between high and low voltages or alternate logical states for demonstration purposes herein.

FIG. 1 illustrates a typical computer workspace set-up. In FIG. 1, notebook computer 100 is coupled to printer 101 through output line 104. In addition, printer 101 is coupled to computer 100 by input line 103. Generally, output line 104 and input line 103 are independent lines which exist within a single cable connecting computer 100 to printer 101. Also, as illustrated in FIG. 1, both computer 100 and printer 101 are independently plugged into power supply 102. As a result, turning off or unplugging computer 100 will have no effect on the power supplied to printer 101. In addition, output line 104 and input line 103 will remain electrically coupled to both computer 100 and printer 101 even when the power to computer 100 is shut off.

For most computer users, the completion of a work session is signified by either turning off computer 100 or by allowing computer 100 to go into sleep or deep power down mode. Most computer users do not turn off or unplug printer 101 because it is either inconvenient or impractical to do so, or because printer 101 is a community printer which if turned off by one user cannot be used by any others in the community. Furthermore, it is inconvenient or impractical to disconnect the cable containing output line 104 and input line 103 from the input/output (I/O) pins at the back of computer 100.

Therefore, as can be seen in FIG. 1, even if the power to computer 100 is shut off, or computer 100 is otherwise powered down, printer 101 can still parasitically operate computer 100 by supplying power to computer 100 through either input line 103 or output line 104. Such parasitic operation of computer 100 has caused significant problems in the past. One problem is damage to the internal circuitry of computer 100. In particular, there have been cases where the battery charging circuitry of a notebook computer has been severely damaged. A second problem that can occur in computer 100 is that certain circuits known as power-up circuits can become confused by the presence of a supply voltage through input line 103 or output line 104. Such confusion has been known to cause unpredictable behavior of computer 100 when it is powered back on. A third problem can occur with printer 101 when computer 100 is turned off. Supply voltages provided by printer 101 on lines 103 and 104 can be fed back into printer 101 as control signals. This can cause erroneous information to be fed back to printer 101, resulting in sporadic and unintentional operation of printer 101 including continuous printer initialization or page ejects. To understand how printer 101 can affect the internal circuitry of computer 100 through the pins coupled to input line 103 and output line 104, it is necessary to examine typical I/O buffers coupled to these pins within computer 100.

The circuit of FIG. 2a illustrates a typical output buffer used in computer 100. The output buffer of FIG. 2a is a conventional inverter circuit where the size of p-channel transistor 201 is very large as compared to standard minimum dimension inverters within the internal circuitry of the IC device. P-channel transistor 201 is scaled large in order to provide the necessary output drive and ESD protection for the IC as described below. Node 200 is the input to the output buffer circuit of FIG. 2a while the output is illustrated as node 203. Node 200 may be coupled to the more sensitive internal circuitry of the IC device from which the output buffer of FIG. 2a receives an input signal. Output node 203 may be coupled to an output pin such as the external pin of computer 100 to which output line 104 of FIG. 1 is attached.

Input node 200 is coupled to gate 207 of p-channel transistor 201 and to the gate of n-channel transistor 202. Output node 203 is coupled to the drain 205 of p-channel transistor 201 and to the drain of n-channel transistor 202. The supply voltage Vdd is coupled to the source 206 and the well 204 of p-channel transistor 201. Finally, the lower supply voltage Vss, which is usually ground, is coupled to the source and well (or substrate) of n-channel transistor 202. Note that Vdd not only supplies voltage to the output buffer of FIG. 2a, but also represents a power supply plane which may supply voltage to many other circuits within the IC, including, for example, circuits which control charging of the battery pack within a notebook computer system.

The power source Vdd, to the circuit of FIG. 2a is disengaged by turning off computer 100 of FIG. 1. However, it is possible for printer 101 to back-power the supply voltage node Vdd through output line 104 of FIG. 1 and into output node 203 of FIG. 2a. This unregulated, back-powered voltage through output node 203 up to the power supply plane of Vdd can travel through the power supply plane to the battery charging circuits of the computer, thereby causing damage to these circuits. To understand how a voltage at output node 203 of the output buffer circuit of FIG. 2a can be transferred up to the supply voltage node at Vdd, it is helpful to analyze the cross-section of p-channel transistor 201.

FIG. 2b is an illustration of the cross-section of p-channel transistor 201 illustrated in the output buffer circuit of FIG. 2a. As shown in FIG. 2b, output node 203 is coupled to the p-type drain 205 of p-channel transistor 201. Input node 200 is coupled to gate 207 of p-channel transistor 201 while Vdd is coupled to the p-type source 206 of p-channel transistor 201 as well as the n-type well tap 208 to n-well 204.

As can be seen in FIG. 2b, if a voltage is applied to output node 203 which is higher than Vdd, the pn junction comprising p-type drain 205 coupled to node 203 and n-well 204 coupled to Vdd will be forward biased. Therefore, current will flow through this forward biased diode from output node 203, into n-well 204, and then up through n-well tap 208 to Vdd. As a result, Vdd will be charged up to a voltage equal to the voltage at output node 203 minus the diode voltage drop between drain 205 and well 204. Coupling of output node 203 to the power supply plane of Vdd is beneficial for purposes of shunting an ESD event occurring at node 203 up to the Vdd plane in order to dissipate the static charge. However, such a configuration is not conducive for protecting internal circuitry of the IC coupled to Vdd, particularly in cases where output node 203 is back powered by an external device.

Note that the ESD protection performance of the circuit of FIG. 2a is improved by employing a large p-channel transistor 201 in order to minimize the resistance path seen by an ESD event between output node 203 and power supply plane Vdd. However, by scaling p-channel transistor 201 large enough to dissipate such an ESD event, this low resistance path between output node 203 and Vdd is similarly seen by a voltage supplied by an external device to output node 203. Thus, while increasing the size of p-channel transistor 201 aides the ESD protection properties of the circuit of FIG. 2a, increasing the size of transistor 201 also increases the likelihood that a peripheral device will back-power Vdd through output node 203 and cause damage to the IC or sporadic operation of the peripheral device.

What is desired is an output buffer circuit comprising large scale transistors to aid in ESD protection while isolating its power supply plane from its output node when the output node voltage is raised above Vdd. Such a buffer would be able to prevent damage to internal circuitry of the IC by preventing back-powering of Vdd through its output node from an active, peripheral device. cl SUMMARY OF THE PRESENT INVENTION A CMOS buffer circuit is described which prevents a voltage applied at its input/output node from reaching its power supply plane, Vdd. The circuit comprises a CMOS inverter having a p-channel pull-up transistor and an n-channel pull-down transistor where the n-well in which the p-channel transistor resides is coupled to Vdd through a pn junction comprising the n-well and a source region of a second p-channel transistor coupled to Vdd. The second p-channel transistor is coupled to the source of the first pull-up p-channel transistor through its drain which is also coupled to the n-well. In one embodiment, the gate of this upper p-channel transistor is controlled by predriver circuitry which briefly turns on this p-channel transistor whenever the output node of the inverter switches from a low to a high state. This allows Vdd to briefly supply the output node in order to pull the output node all the way up to Vdd.

In another embodiment, the gate of the upper p-channel transistor is controlled by predriver circuitry which ensures that this p-channel transistor is turned on only when full power is applied to Vdd. This allows Vdd to be supplied to the second (lower) p-channel transistor so that the output node can be pulled all the way up to Vdd. The lower p-channel pull-up transistor of this inverter may be scaled large enough to dissipate an ESD event occurring at the output node, while a voltage applied to the output node is prevented from reaching the Vdd plane by reverse biasing of the pn junction. Such an output buffer may be incorporated into a computer system in order to prevent the internal circuitry of the computer system from being inadvertently powered up by a peripheral device coupled to the I/O pins of the computer system.

BRIEF DESCRIPTION OF THE DRAWINGS

FIG. 2b is an illustration of a cross-section of the p-channel transistor shown in FIG. 2a.

DETAILED DESCRIPTION

A CMOS voltage supply isolation output buffer circuit is described which prevents Vdd from being back-powered through the output node of the circuit. In the following description, numerous specific details, such as device types, voltage levels, circuit configurations, etc., are set forth in order to provide a more thorough understanding of the present invention. It will be obvious, however, to one skilled in the art, that the present invention may be practiced without employing these specific details. In other instances, well-known circuit design techniques and operations have not been described in detail in order to avoid unnecessarily obscuring the present invention.

Figure 3:
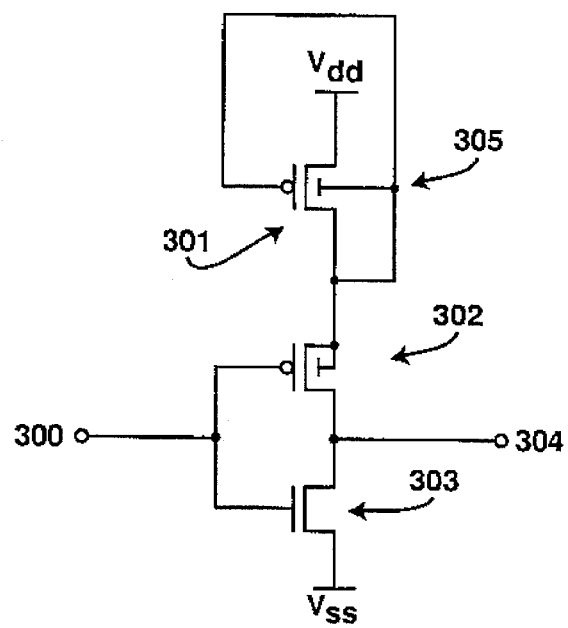
FIG. 3 is an illustration of an output buffer circuit in accordance with the present invention. The conductivity types of the substrate regions are indicated by the corresponding notations "n" and "p" in FIG. 3.)
Figure 4:
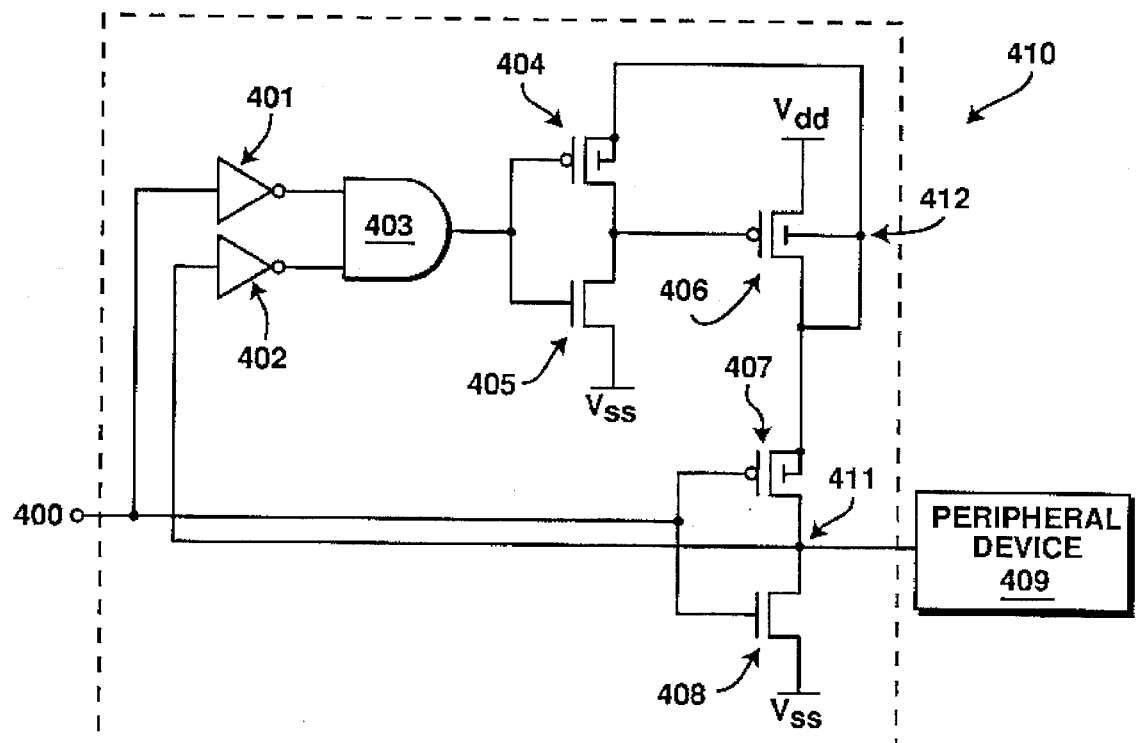
FIG. 4 is an illustration of an output buffer circuit in accordance with the present invention including predriver circuitry.
Figure 5:
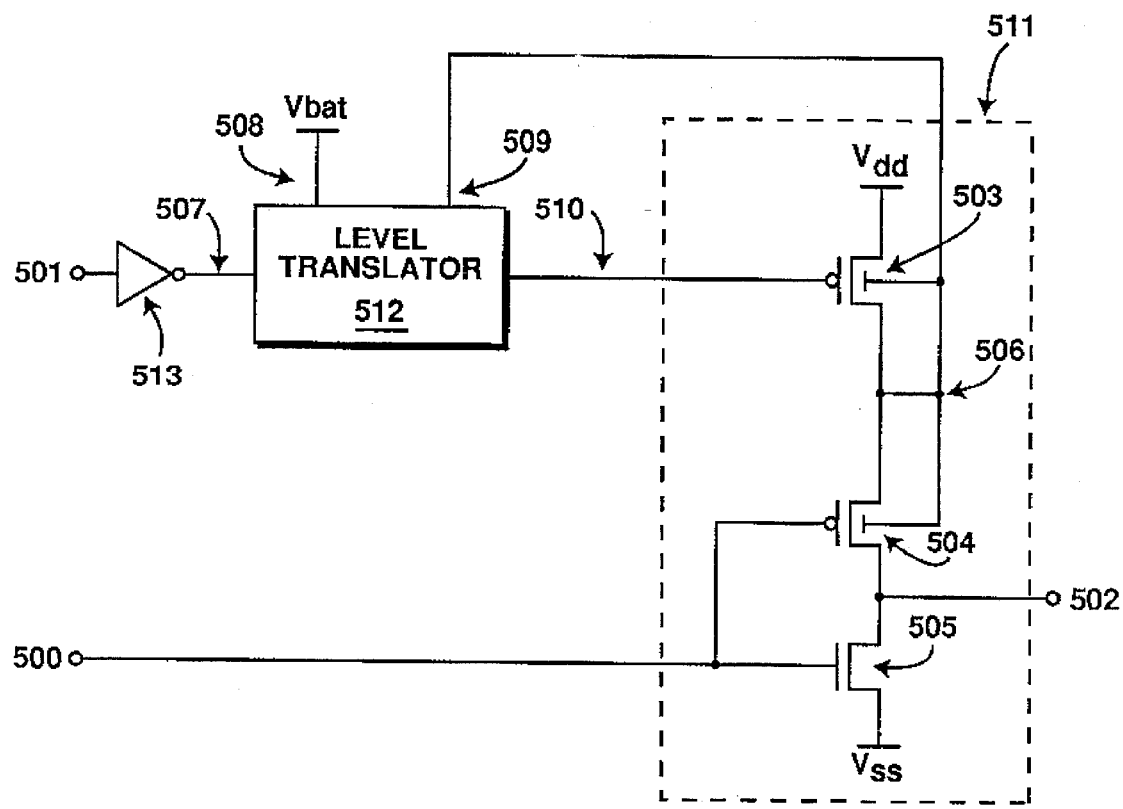
FIG. 5 is an illustration of an output buffer circuit in accordance with the present invention including the use of a POWERGOOD signal.

While diagrams representing certain embodiments of the present invention are illustrated in FIGS. 3, 4 and 5, these illustrations are not intended to limit the invention. The specific circuits described herein are only meant to help clarify one's understanding of the present invention and to illustrate particular embodiments in which the present invention may be implemented. It will be appreciated by one skilled in the art that the broader spirit and scope of the present invention, as set forth in the appended claims, can be applied to any type of circuit which seeks the performance achievements attained by the present invention.

FIG. 3 illustrates a circuit configured in accordance with the present invention. Input node 300 is coupled to the gate of p-channel transistor 302 and the gate of n-channel transistor 303. Output node 304 is coupled to the drain of p-channel transistor 302 and the drain of n-channel transistor 303. Vss is coupled to the source and bulk of n-channel transistor 303 while the source of p-channel transistor 302 is coupled to the drain of p-channel transistor 301. The gate of p-channel transistor 301 is coupled to its well and to the source of p-channel channel transistor 302. Well 305 of p-channel transistors 301 and 302 is also coupled to the source of p-channel transistor 302. The source of p-channel transistor 301 is coupled to Vdd.

As can be seen in the output buffer circuit of FIG. 3, an additional, upper p-channel transistor 301 is coupled to an inverter circuit comprising input node 300, pull-up p-channel transistor 302, pull-down n-channel transistor 303, and output node 304. The output buffer circuit of FIG. 3 must be analyzed in two different modes in order to fully demonstrate the advantages of this circuit. First, the circuit of FIG. 3 must be analyzed assuming power to the device is switched on. In this mode, power is supplied to the circuit of FIG. 3 through Vdd. Then, the output buffer circuit of FIG. 3 must be analyzed assuming that power to the device is switched off. In this powered off mode, no voltage is applied to the circuit through Vdd.

Assuming that the IC comprising the output buffer of FIG. 3 is turned on, supply voltage Vdd will be applied to the source of p-channel transistor 301 and to n-well 305 of p-channel transistors 301 and 302 through the forward-biased diode comprising the p-type source of p-channel transistor 301 and n-well 305 in which p-channel transistors 301 and 302 reside. Therefore, the voltage in the n-well 305 region in which p-channel transistors 301 and 302 reside will be the supply voltage Vdd minus a voltage drop across the source to well pn junction diode of transistor 301. Since the source of p-channel transistor 302 is coupled to its well 305, the voltage supply to the source of p-channel transistor 302 will also be equal to Vdd minus the pn junction voltage drop. P-channel transistor 302 and n-channel transistor 303 are coupled to each other and to input node 300 and output node 304 in a standard inverting configuration which is supplied by the voltage existing within n-well 305 of transistor 302. Therefore, as input node 300 goes high, p-channel transistor 302 will be turned off while n-channel pull-down transistor 303 will be turned on, pulling output node 304 down to Vss. When input node 300 goes low, n-channel transistor 303 will be turned off while p-channel pull-up transistor 302 will be turned on pulling output node 304 up to the source potential of transistor 302. Alternatively, pull-up transistor 302 may be replaced by alternate pull up circuits or devices such as a resistor, and similarly, pull down transistor 303 may be replaced by alternate pull down circuits or devices.

Assuming supply voltage Vdd is shut off or the voltage applied to output node 304 is greater than Vdd, a voltage applied to output node 304 will forward bias the pn junction diode comprising the p-type drain of transistor 302 and n-well 305 in which it resides. Therefore, the voltage on output node 304 will charge up the n-well to a voltage equal to the voltage at output node 304 minus the pn junction voltage drop to n-well region 305. However, unlike the circuit configuration of FIG. 2a, there is no n-well tap coupled to Vdd in the circuit of FIG. 3. Instead, Vdd is coupled to the well through the pn junction formed by the source of p-channel transistor 301 and n-well 305. Because this pn junction will be reversed biased when the voltage in n-well 305 is greater than Vdd, the n-well voltage will be isolated from Vdd in this direction. Extrapolating back to output node 304, any voltage applied to output node 304 which is greater than Vdd will serve to reverse bias the pn junction coupling Vdd to the n-well region, thereby isolating the voltage applied to output node 304 from Vdd.

The rectifying nature of the diode which isolates Vdd from output node 304 whenever the voltage at output node 304 rises higher than Vdd has many useful applications. In one embodiment, the voltage supply isolation buffer circuit of FIG. 3 may be used to replace conventional output buffer circuits in devices in which back-powering the power supply plane Vdd through output node 304 can cause damage to the device. For example, in the configuration of FIG. 1, if the voltage supply isolation buffer circuit of FIG. 3 is used to couple the internal circuitry of computer 100 to output line 104, then upon switching off or otherwise powering down computer 100, printer 101 or any other peripheral device coupled to computer 100 will be unable to back-power the supply voltage to computer 100 through output line 104. Alternatively, the voltage supply isolation buffer of FIG. 3 may be used to isolate an IC operating at a supply voltage which is lower than the supply voltage used by an external device to which it is coupled. For example, if the output buffer circuit of FIG. 3 is incorporated into a microprocessor operating off a supply voltage of 3 volts, output node 304 may be coupled to an external device operating off a voltage supply of 5 volts without danger that the 5 volts used to supply the external device will raise the voltage level of the microprocessor which could potentially harm sensitive internal circuitry within the microprocessor.

In addition to isolating a voltage applied to output node 304 from power supply Vdd, the voltage supply isolation buffer circuit of FIG. 3 may be suitably employed for ESD protection purposes. P-channel transistor 302 may be scaled as large as is required in order to dissipate an ESD event at output node 304 while still sufficiently isolating any voltage applied to output node 304 from the power plane at Vdd. A practitioner may simply employ alternate ESD protection techniques coupled to n-well 305 of this buffer circuit to aid in the dissipation of an ESD event. Therefore, a practitioner may appropriately size and scale the transistors and interconnect lines of the circuit of FIG. 3 in order to protect sensitive circuitry coupled to input node 300 without negatively impacting the overall effectiveness of this voltage supply isolation output buffer. Each n-well 305 from a plurality output buffers of this type can be connected together to share their ESD protection circuits and make the IC more robust to ESD events. Further, this also insures that if any output node 304 is connected to a high voltage source, all the wells 305 will be at a high level, so all will be isolated from Vdd.

In an alternate embodiment of the present invention, p-channel transistor 301 may be replaced by a pn junction diode with Vdd coupled to the p region of the diode, and the source and well of p-channel transistor 302 coupled to the n region of the diode. Such an embodiment is a simplification of the embodiment of FIG. 3 where in FIG. 3 the pn junction comprises the source-well junction of transistor 301. Note that the gate of transistor 301 is connected to its well in order to prevent p-channel transistor 301 from turning on. Configuring p-channel transistor 301 in this manner prevents a voltage applied to output node 304 from raveling through the channel between the drain of transistor 301 to the source of transistor 301 and up to Vdd. In another embodiment, the gates of p-channel and n-channel transistors 301 and 303, respectively, are independently controlled. Such an embodiment may be useful to, for example, turn both transistors off in order to place the buffer into a high impedance mode.

Unfortunately, in the buffer circuit embodiment of FIG. 3, this passive diode isolation configuration does not allow pull-up transistor 302 to pull output node 304 all the way up to Vdd when input node 300 switches low. Pull-up p-channel transistor 302 is only capable of pulling output node 304 up to the voltage at the source of p-channel transistor 302 which is a pn diode voltage drop below Vdd. In order to pull output node 304 all the way up to Vdd, predriver circuitry is necessary to control the switching operation of p-channel transistor 301.

FIG. 4 illustrates an embodiment of the voltage supply isolation output buffer of FIG. 3 in which predriver circuitry is incorporated to control the switching operation of the upper p-channel transistor in order to pull the output node all the way up to Vdd when the input to the buffer circuit switches low. Circuit 410 of FIG. 4 comprises p-channel pull-up transistor 407 and n-channel pull-down transistor 408 configured to invert input signal 400 substantially as described above in conjunction with FIG. 3. Input node 400 is coupled to the gates of p-channel transistor 407 and n-channel transistor 408. In the embodiment illustrated in FIG. 4, input node 400 is also coupled to the input of inverter 401 whose output is coupled to the upper input of AND gate 403. The drains of p-channel transistor 407 and n-channel transistor 408 are coupled to output node 411 which is in turn coupled to the input of inverter 402 and to an external peripheral device 409. The output of inverter 402 is coupled to the lower input of AND gate 403. The output of AND gate 403 is the input to the inverter circuit comprising p-channel transistor 404 and n-channel transistor 405 where the output of AND gate 403 is coupled to the gates of transistors 404 and 405. The drains of transistors 404 and 405 are coupled to the gate of p-channel transistor 406. The source of n-channel transistor 405 is coupled to Vss while the source of p-channel transistor 404 is coupled to n-well 412. P-channel transistors 404, 406 and 407 all reside within the same n-well 412. The source of p-channel transistor 406 is coupled to Vdd while its drain is coupled to both n-well 412 and the source of p-channel transistor 407. Finally, the source of n-channel transistor 408 is coupled to Vss.

Note that in the circuit configuration of FIG. 4, inverters 401 and 402 coupled to the inputs of AND gate 403 are functionally equivalent to a single, dual input NOR gate. Therefore, in an alternate embodiment of the present invention, a single dual input NOR gate is employed in place of inverters 401, 402, and AND gate 403. Also in an alternate embodiment of the present invention, p-channel transistors 404, 406 and 407 may reside in separate n-wells which are coupled by interconnect lines. In another embodiment, the gates of p-channel and n-channel transistors 407 and 408, respectively, are independently controlled. Such an embodiment may be useful to, for example, turn both transistors off in order to place the buffer into a high impedance mode.

In order to fully appreciate the operation and advantages of the buffer circuit 410, it is necessary to analyze this circuit under two separate modes of operation. First, analyzing the circuit under normal bias conditions with the IC device powered on, it can be seen that when input node 400 goes high, p-channel transistor 407 will be turned off while n-channel pull-down transistor 408 will be turned on, thereby pulling output node 411 down to Vss. When input node 400 switches low, n-channel transistor 408 will be turned off and p-channel pull-up transistor 407 will be turned on. At this instant, before output node 411 is pulled up by p-channel transistor 407, the input to inverter 401 will be low as will the input to inverter 402. As a result, AND gate 403 will see high voltage states at both inputs. Performing a logical AND function to these two high inputs yields a high output from AND gate 403. This high output will be transmitted to the gate of p-channel transistor 404, turning it off, and to the gate of n-channel transistor 405, turning it on.

N-channel pull-down transistor 405 will then bring the gate of p-channel transistor 406 down to Vss, turning it on. This will allow Vdd to flow through p-channel transistor 406 to the source of p-channel pull-up transistor 407. As stated earlier, p-channel transistor 407 will be turned on by the low input voltage at input node 400. Therefore, p-channel pull-up transistor 407 will pull output node 411 up to the voltage at the source of p-channel transistor 407. At this instant, the voltage at the source of p-channel transistor 407 will be Vdd, so output node 411 will be pulled up to Vdd.

Once output node 411 is pulled high, this high voltage will be fed back into inverter 402, changing the state at the lower input to AND gate 403 to be low. This will cause the output of AND gate 403 to go low thereby turning off n-channel transistor 405 and turning on p-channel pull-up transistor 404. Pull-up transistor 404 will pull the gate voltage to p-channel transistor 406 up to the voltage at the source of p-channel transistor 404. This voltage will be approximately equal to the well voltage of p-channel transistor 406 which, as described above, will be approximately equal to Vdd minus the pn diode voltage drop between the source of transistor 406 and its well. As a result, p-channel transistor 406 will be turned off, thereby again isolating Vdd from the source of p-channel transistor 407 and output node 411. The source voltage of p-channel transistor 407 will then fall to the voltage level of the n-well of transistor 406 thereby allowing output node 411 to also fall to this voltage level.

As described above, when the input voltage to input node 400 of the output buffer circuit 410 goes low, the voltage at output node 411 is initially pulled up to Vdd and then allowed to settle down to the voltage at the well of transistor 406 which is approximately equal to Vdd minus a pn junction voltage drop. The predriver circuitry coupled to the gate of p-channel transistor 406 is what allows output node 411 to initially be pulled all the way up to Vdd for a brief period of time. This predriver circuitry briefly turns on p-channel transistor 406 which serves two important uses. First, by applying Vdd to the source of pull up transistor 407, output node 411 will switch to a high state faster than it would if the source voltage of pull up transistor 407 were lower than Vdd. This improves the speed performance of the overall circuit. Second, by initially pulling output node 411 up to Vdd, any circuitry coupled to output node 411, such as circuitry existing within peripheral device 409, will see a full voltage swing at its input thereby assuring that external devices coupled to output node 411 will be properly and fully triggered.

The length of time which output node 411 is raised to Vdd depends primarily on the triggering of the upper input to AND gate 403. In the embodiment illustrated in FIG. 4, for example, the upper input to AND gate 403 is triggered one gate delay before the lower input to AND gate 403 switches to a low state. In particular, output node 411 will be pulled up to Vdd for the approximately length of time it takes for the inverter comprising p-channel pull-up transistor 407 and n-channel pull-down transistor 408 to invert a signal at its input 400 to its output 411.

Alternatively, a signal line may be located within the internal circuitry coupled to input node 400 that carries a voltage which is inverted with respect to the signal at input node 400 and yet arrives before or at the same time the input voltage to input node 400 switches. In such an embodiment, this signal line may be routed directly to the upper input of AND gate 403 in order to cause the output node 411 to be pulled up to Vdd for a longer period of time. Of course, in such an embodiment, inverter 401 will not be necessary. Another way to lengthen the period of time during which output node 411 is pulled up to Vdd is to place delay circuitry on the feedback path between output node 411 and the lower input to AND gate 403.

It is now helpful to analyze circuit 410 in the case where the supply voltage Vdd to the IC device incorporating output buffer circuit 410 is shut off while peripheral device 409 drives a voltage into output node 411. As the voltage at node 411 rises, the pn junction comprising the p-type drain and the n-type well of p-channel transistor 407 will be forward biased. This forward bias will allow the rising voltage at node 411 to be transmitted through to the well of transistors 407, 406 and 404. As this well voltage rises, the pn junction comprising the p-type source and the n-type well of p-channel transistor 406 will become reversed biased, thereby preventing the voltage applied to the n-well from reaching the Vdd power plane.

Since no voltage will be applied to AND gate 403, the output from AND gate 403 will be low, thereby allowing p-channel transistor 404 to turn on as its well voltage increases. This will pull the drain of p-channel transistor 404, which is coupled to the gate of p-channel transistor 406, up to the source voltage of p-channel transistor 404, which is coupled to the well of p-channel transistor 406. Therefore, since the gate of p-channel transistor 406 will be coupled to its own well through transistor 404, p-channel transistor 406 will remain off, thereby eliminating the danger that the voltage at input node 411 will pass through the source to drain channel of p-channel transistor 406 and backpower Vdd. Consequently, even if peripheral device 409 supplies a voltage to output node 411 while buffer circuit 410 is powered off, this voltage will be isolated from the Vdd power supply plane thereby protecting any sensitive internal circuitry coupled to this power supply plane. In addition, as described above, p-channel transistor 407 may be appropriately sized, multiple n-wells of similar buffer circuits may be coupled together, and appropriate ESD protection circuitry may be coupled to well 412 in order to dissipate electrostatic discharge occurring at input node 411.

FIG. 4 illustrates a means for driving the output buffer signal 411 all the way up to Vdd without the need for additional signals or supply voltages. However, some circuits and IC devices incorporate other computer functions that require that they be properly powered on at all times. These circuits use signals from the computer's power supply to tell it when the power supply is on and stable. A typical circuit that requires the power to be supplied at all times is the real-time clock (RTC) that keeps track of the time and date when the computer is turned on or off. It gets its power from a battery inside the computer when the power is off. The RTC and other circuits get a signal from the computer's power supply to tell it when the power supply's voltage is or is not "good", that is, whether or not it is at a sufficient level for reliable operation. This signal is called the POWERGOOD signal. If an IC device requiring a voltage supply isolation buffer receives this POWERGOOD signal, then a simpler circuit can be used.

FIG. 5 illustrates a buffer circuit in accordance with the present invention in which a POWERGOOD signal is received. This buffer has two main parts, the output buffer stage 511 and a level translator circuit 512. Output buffer stage 511 of FIG. 5 comprises p-channel transistors 503 and 504 which are in the same n-well 506. The source of transistor 504 is coupled to the drain of transistor 503 while the source of transistor 503 is coupled to Vdd. The drain of p-channel transistor 504 and the drain of n-channel transistor 505 are coupled to output node 502. The source of n-channel transistor 505 is coupled to Vss. Input node 500 is coupled to the gates of p-channel transistor 504 and n-channel transistor 505. The gate of p-channel transistor 503 is coupled to the output of level translator 512 by signal line 510. In another embodiment, the gates of p-channel and n-channel transistors 504 and 505, respectively, are independently controlled. Such an embodiment may be useful to, for example, turn both transistors off in order to place the buffer into a high impedance mode.

The specific circuit implementation of level translator 512 is not given in detail as there are many circuits known to those skilled in the art. The function of level translator 512 is to take an input signal 507 which swings between Vss and some supply voltage 508 and produces a new signal of the same logical value but which swings between Vss and the voltage at line 509 which is coupled to n-well 506. This new signal is output from level translator 512 on signal line 510. Input signal 507 is the output from inverter 513 which inverts input signal 501.

In the embodiment of FIG. 5, voltage source 508 comes from the RTC's battery voltage (Vbat) which is always present. Signal 501 is an internal version of the POWERGOOD signal that the RTC uses to decide whether it should isolate itself from outside access, a condition which occurs when the power supply (Vdd) is not at a reliable operating level (not "good"). When signal 501 is high, the power is good. Inverter 513 is powered from Vbat and inverts the logical level of POWERGOOD signal 501. The level translator takes this inverted version of the POWERGOOD signal and converts it to a signal which swings between Vss and the voltage on line 509 which is the voltage at n-well 506. If the power is good, signal 501 is at Vbat and signal 510 is at Vss. If the power is not good (occurring when the computer's power supply is switched off or is in the process of stabilizing after being switched on) then the signal 501 is at Vss and the signal on line 510 is at the voltage level of n-well 506.

Therefore, it can be seen that if the power is good, the voltage on line 510, which is coupled to the gate of p-channel transistor 503, will go to Vss, turning or transistor 503 and pulling n-well 506 and the source of p-channel transistor 504 to Vdd. This allows output node 502 to be pulled up to Vdd when input node 500 is at Vss. If the power to the computer is switched off, the POWERGOOD signal 501 will go to Vss and the level translator output signal on line 510 will go to the voltage at n-well 506. This will turn off p-channel transistor 503, isolating n-well 506 from Vdd as before. Vdd is now free to drop to zero volts without drawing current from n-well 506 or output node 502. P-channel transistor 504 can be appropriately sized, the n-wells of similar buffers may be coupled together, and ESD protection devices may be added as before to accommodate ESD requirements.

Figure 1:
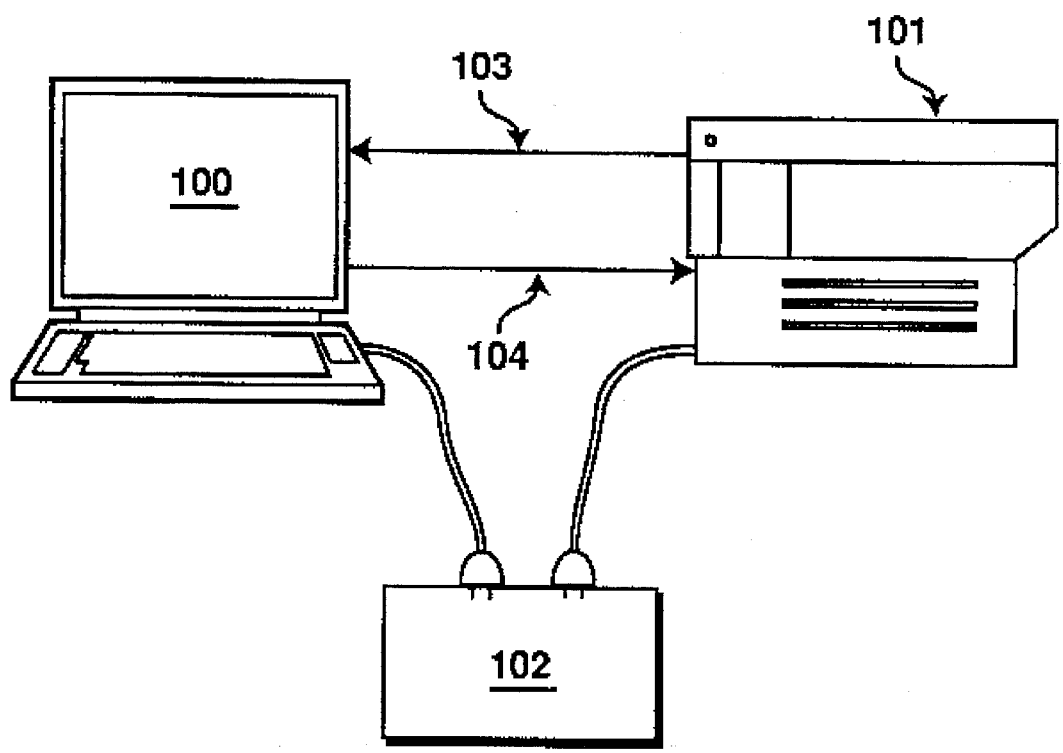
FIG. 1 is an illustration of a computer workspace configuration.
Figure 2A:
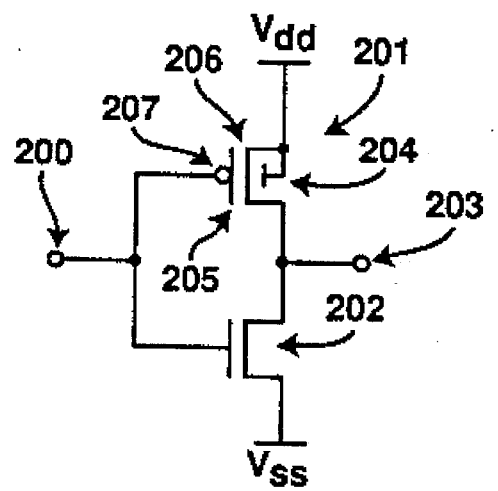
FIG. 2a is an illustration of an output buffer circuit.
Figure 2B:
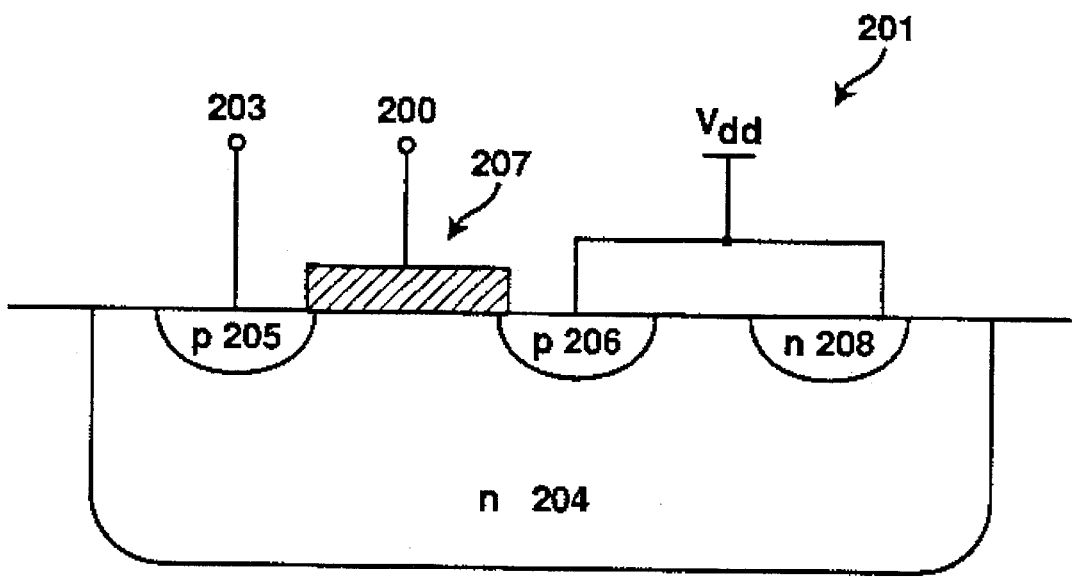

Pins which only have input buffers on them, such as those buffer circuits coupled to line 103 in FIG. 1, may also have voltage supply isolating circuits and ESD protection circuits on them. An output buffer structure such as the one shown in FIG. 2a is typically employed on standard inputs as a part of the ESD protection circuitry, with some slight modifications. Instead of driving the output buffer structure from input node 200, the gate of the n-channel transistor 202 is coupled to Vss and the gate of the p-channel transistor is coupled to Vdd. This turns off both driver transistors, but preserves their ability to act as ESD protection devices. Node 203 is then allowed to pass through the circuit between the drains of p-channel transistor 201 and n-channel transistor 202.

Figure 6:
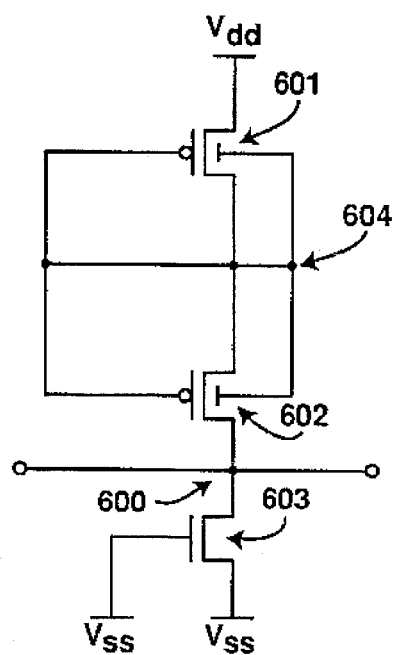
FIG. 6 is an illustration of a buffer circuit in accordance with the present invention suitable for use as an input buffer.

A similar strategy is used with the present invention to ESD protect input buffers while maintaining the voltage supply isolating characteristics. FIG. 6 illustrates an embodiment of the present invention for input pins. The structure looks very much like the output buffer of FIG. 3, except that the gates of both p-channel transistors are coupled to the n-well and the gate of the n-channel transistor is coupled to Vss. The source of p-channel transistor 601 is coupled to Vdd while its gate and drain are both coupled to n-well 604. P-channel transistor 602 resides within the same n-well 604 and has its gate and source coupled to this n-well 604. The drain of p-channel transistor 602 and the drain of n-channel transistor 603 are both coupled to node 600. Node 600 carries an input voltage to the IC device. The gate and source of n-channel transistor 603 are both coupled to Vss. In an alternate embodiment of the present invention, the well in which p-channel transistor 602 resides is physically separated from, but electrically coupled to the well in which p-channel transistor 601 resides.

With the gates of the transistors of FIG. 6 connected as described above, all the devices are held in their off state. N-well 604 will be charged to a diode voltage drop below Vdd when the computer is powered on, as before. The pn diode at the source of p-channel transistor 601 will isolate the Vdd power supply line from n-well 604 when Vdd is less than the n-well's voltage. Again the transistors of a plurality of these input buffers can be sized and coupled together for greater ESD protection.

Figure 7:
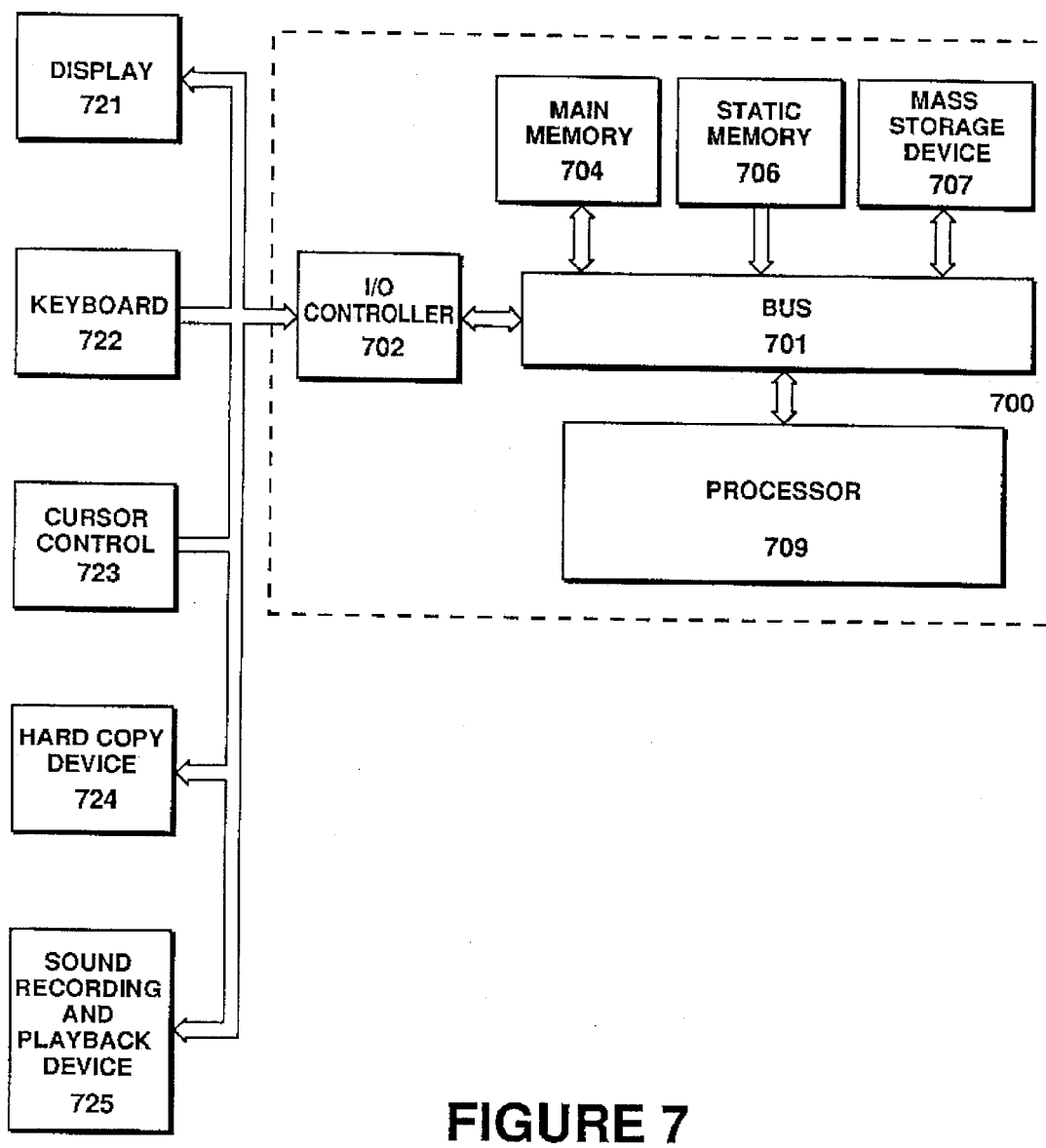
FIG. 7 is an illustration of an implementation of the present invention in a computer system.

A circuit of the type described herein may be used in an I/O controller in conjunction with a computer system. Referring to FIG. 7, the computer system within which the present invention may be implemented is shown as 700. Computer system 700 comprises a bus, or other communication means 701, for communicating information, and a processing means 709 coupled with bus 701 for processing information. System 700 further comprises a random access memory (RAM) or other dynamic storage device 704 (referred to as main memory) coupled to bus 701 for storing information and instructions to be executed by processor 709. Main memory 704 also may be used for storing temporary variables or other intermediate information during execution of instructions by processor 709. Computer system 700 also comprises a read only memory (ROM) and/or other static storage device 706 coupled to bus 701 for storing static information and instructions for processor 709. Data storage device 707 is also coupled to bus 701 for storing information and instructions.

A data storage device 707, such as a magnetic disk or optical disk, and its corresponding disk drive can be coupled to computer system 700. Computer system 700 can also be coupled via bus 701 through I/O controller 702 to various peripheral devices. A voltage supply isolation buffer may be incorporated within I/O controller 702 to prevent peripheral devices from damaging sensitive internal circuitry of computer system 700 when, for example, the system is powered off while a peripheral device is powered on. An output node of the buffer circuit described herein may be coupled to an output pin of computer system 700 and connected via cable or other interconnect means to a display device 721 such as a cathode ray tube (CRT) for displaying information to a computer user. An alpha-numeric input device 722, including alpha-numeric and other keys, is typically coupled to bus 701 through I/O controller 702 for communicating information and command selections to processor 709. Another type of user input device is cursor control 723 such as a mouse, trackball, or cursor direction keys for communicating direction information and command selections to processor 709 and for controlling cursor movement on display 721. This input device typically has two degrees of freedom in two axes. A first axis (e.g., X) and a second axis (e.g., Y) which allows the device to specify positions in a plane.

Another device which may be coupled to I/O controller 702 is a hard copy device 724 which may be used for printing instructions, data or other information on a medium such as paper, film or other similar types of media. Additionally, computer system 700 can be coupled to a device for sound or video recording and/or playback 725 such as an audio or video digitizer coupled to a microphone or camera for recording information. Further, the device may include a speaker which is coupled to a digital-to-analog (D/A) converter for playing back digitized sounds. Finally, computer system 700 can be a terminal in a computer network (e.g., a LAN). Note that CRT's 721, hard copy devices 724 and sound recording and playback devices 725 are of particular concern to the computer user since these devices are typically powered independently from computer system 700. Therefore, these devices can potentially harm the circuitry of computer system 700 unless a buffer circuit of the type described herein is not employed to isolate these devices from computer system 700.

Thus, a voltage supply isolation buffer circuit, which may be employed to protect internal circuitry of an IC device from damage, has been described. This buffer circuit is compatible with conventional ESD protection techniques, and specific implementations of such a circuit have been described.

What is claimed is:

1. A buffer for an integrated circuit comprising:

an input node;

an output node;

a first p-channel transistor having a source and a drain disposed in a well, and a gate, said source being coupled to a first supply potential, and said well being coupled to said drain;

a second p-channel transistor having a source and a drain disposed in a well, and a gate, said source and said well of said second p-channel transistor being coupled to said drain of said first p-channel transistor, said drain of said second p-channel transistor being coupled to said output node of said buffer; and a n-channel transistor having a drain coupled to said output node, a source coupled to a second supply potential, and a gate coupled to said input node and to said gate of said second p-channel transistor.

2. The buffer of claim 1 further comprising:

predriver circuitry coupled to said gate of said first p-channel transistor, said predriver circuitry being configured such that said first p-channel transistor is briefly turned on when a voltage at said output node transitions from a low to a high state, thereby pulling said output node up to approximately said first supply potential.

3. The buffer circuit of claim 1 wherein said gate of said first p-channel transistor is coupled to said well.

4. The buffer of claim 1 further comprising:

predriver circuitry coupled to said gate of said first p-channel transistor, said predriver circuitry being configured such that said first p-channel transistor is turned on only when said first supply potential is at a reliable operating level, thereby allowing said output node to be pulled up to approximately said first supply potential whenever said second p-channel transistor is turned on.

5. The buffer circuit of claim 1 wherein a voltage applied to said output node by an external device is isolated from said first supply potential by the rectifying nature of a junction formed by said well and said source of said first p-channel transistor.

6. The buffer circuit of claim 2 wherein said predriver circuitry comprises;

inverter having first and second supply connection nodes, an input, and an output, said first supply connection node being coupled to said well of said first p-channel transistor and said second supply connection being coupled to said second supply potential; and an AND gate having a first inverted input coupled to said input node, said AND gate having a second inverted input coupled to said output node, said AND gate further having an output coupled to said input of said inverter, said output of said inverter being coupled to said gate of said first p-channel transistor.

7. The buffer circuit of claim 1 wherein said second p-channel transistor is scaled to dissipate an electrostatic discharge voltage at said output node.

8. An inverter operating between first and second supply potentials, said inverter comprising:

a first p-region coupled to said first supply potential;

a n-region joined to said first p-region to form a pn junction;

a second p-region disposed in said n-region wherein said first and second p-regions form a drain and a source, respectively, of a second p-channel transistor;

a first p-channel transistor having a source, a drain, and a gate, said first p-channel transistor being disposed in a n-well of a semiconductor substrate, said n-well being coupled to said source and said n-region of said pn junction and to said drain of said second p-channel transistor;

a n-channel transistor having a source coupled to said second supply potential, a drain, and a gate, said first p-channel transistor being disposed in a p-well of said semiconductor substrate;

an input node coupled to the gate of said first p-channel transistor and said gate of said n-channel transistor;

an output node coupled to the drain of said first p-channel transistor and to the drain of said n-channel transistor, said pn junction isolating said first supply potential from a potential applied to said output node, said potential being higher than said first supply potential.

9. The inverter of claim 8 further comprising:

predriver circuitry coupled to said gate of said first p-channel transistor, said predriver circuitry being configured such that said first p-channel transistor is briefly turned on when a voltage at said output node transitions from a low to a high state, thereby pulling said output node up to approximately said first supply potential.

10. The inverter of claim 8 wherein a gate of said second p-channel transistor is coupled to said n-well.

11. The inverter of claim 8 further comprising:

predriver circuitry coupled to said gate of said first p-channel transistor, said predriver circuitry being configured such that said first p-channel transistor is briefly turned on when a voltage at said output node transitions from a low to a high state, thereby pulling said output node up to approximately said first supply potential.

12. The inverter of claim 8 wherein said first p-channel transistor is scaled to dissipate an electro-static discharge voltage at said output node.

13. A computer system comprising:

a peripheral device;

a memory for storing information;

a processor coupled to said memory;

an input/output (I/O) controller coupled to said processor for controlling data flow to and from said peripheral device, said I/O controller having a buffer circuit which includes:

an input node;

first and second p-channel transistors disposed in an n-well of a semiconductor substrate, the source of said first p-channel transistor forming a pn junction with said n-well and being coupled to a first supply potential, the source of said second p-channel transistor being coupled to said n-well and to the drain of said first p-channel transistor;

a n-channel transistor having a drain, a source coupled to a second supply potential and a gate coupled to said input node and to the gate of said second p-channel transistor an output node coupled to the drain of said second p-channel transistor and to the source of the n-channel transistor, said pn junction providing reverse bias isolation to said supply potential when said output node is at a potential higher than said first supply potential.

14. The computer system of claim 13 wherein said output node is coupled to an I/O pin of said computer system.

15. The computer system of claim 14 wherein said buffer circuit further comprises:

predriver circuitry coupled to the gate of said first p-channel transistor, said predriver circuitry being configured such that said first p-channel transistor is on when said second p-channel transistor turns on, thereby pulling said output node approximately up to said first supply potential, said first p-channel transistor being off when said output node is at a potential higher than said supply potential.

16. The computer system of claim 13 wherein said second p-channel transistor is a pull-up transistor of an inverter.

* * * * *

UNITED STATES PATENT AND TRADEMARK OFFICE
CERTIFICATE OF CORRECTION

PATENT NO. : 5,543,734
DATED : August 6, 1996
INVENTOR(S) : Volk et al.

It is certified that error appears in the above-identified patent and that said Letters Patent is hereby corrected as shown below:

In column 4 at line 39 delete "invention. The" and insert --invention. (The--

In column 7 at line 7 delete "raveling" and insert --traveling--

In column 10 at line 54 delete "or" and insert --on--

In column 13 at line 20 delete "comprises;" and insert --comprises:--

In column 13 at line 21 insert --an-- prior to "inverter"

In column 14 at line 47 delete "1/O" and insert --I/O--

Signed and Sealed this

Fifth Day of November, 1996

Attest:

BRUCE LEHMAN

Attesting Officer

Commissioner of Patents and Trademarks